(12) United States Patent
Hasegawa

(10) Patent No.: US 6,233,720 B1
(45) Date of Patent: *May 15, 2001

(54) LOGIC CIRCUIT ANALYSIS SYSTEM FOR DELETING PSEUDO ERROR

(75) Inventor: Takumi Hasegawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/037,875

(22) Filed: Mar. 10, 1998

(30) Foreign Application Priority Data

Mar. 10, 1997 (JP) .................................................. 9-072619

(51) Int. Cl.$^7$ ...................................................... G06F 17/50
(52) U.S. Cl. ........................................ 716/6; 716/5; 716/4
(58) Field of Search ........................ 395/500.07, 500.06, 395/500.03, 500.05; 716/6, 5, 2, 4

(56) References Cited

U.S. PATENT DOCUMENTS 5,815,655 * 9/1998 Koshiyama ..................... 395/183.21

FOREIGN PATENT DOCUMENTS

| 6-295324 | 10/1994 | (JP) . |
| 7-249060 | 9/1995 | (JP) . |
| 8-147344 | 6/1996 | (JP) . |

* cited by examiner

*Primary Examiner*—Matthew Smith
*Assistant Examiner*—Vuthe Siek
(74) *Attorney, Agent, or Firm*—Sughrue, Mion, Zinn, Macpeak & Seas, PLLC

(57) ABSTRACT

A verifier verifies a correctness of a pseudo erroneous path stored in a designation memory. The pseudo erroneous path verified by the verifier is inputted to an analyzer via a designation input terminal. A path manager extracts paths from circuit information stored in a circuit information memory. From the extracted paths, the pseudo erroneous paths stored in the foregoing designation memory are deleted whereby paths are selected. A delay time calculator computes a delay time for each of the selected paths. The computed delay times are stored in a result memory together with corresponding paths thereto.

8 Claims, 10 Drawing Sheets

LOGIC CIRCUIT ANALYSIS SYSTEM FOR DELETING PSEUDO ERROR

BACKGROUND OF THE INVENTION

The present invention relates to a system which analyzes a logic circuit based on designations input by users, in order to exclude pseudo errors, more particularly to a logic circuit analysis system for confirming the correctness of the designations.

In a design step of the logic circuit, a delay analysis is performed in order to confirm whether a delay time of a signal path in the designed logic circuit satisfies design requirements.

Referring to FIG. 9, a conventional delay analysis system comprises a circuit information memory 1, an analyzer 200, and a result memory 3. The circuit information memory 1 stores information which defines a circuit configuration of an analysis target. The analyzer 200 performs the delay analysis depending on the circuit information stored in the circuit information memory 1. Moreover, the analyzer 200 includes a path extractor 201 and a delay time calculator 202. The path extractor 201 obtains a path in a depth direction according to a Depth First Search method (hereinafter, referred to as a DFS method). The delay time calculator 202 computes a delay time of each path. The computation results are stored in the result memory 3 together with information of each path.

From the analysis results stored in the result memory 3, paths that do not satisfy design requirements are found, that is, erroneous paths are found.

In order to extract a path automatically according to the DFS method, from among the paths to be extracted, logically meaningless paths (e.g., redundancy paths) may be included in the path extractor 201. For example, in the circuit shown in FIG. 10, when a level of a pin-c is at "0", a pin-a is selected, whereby the path expressed by "pin-a→selector →circuit→pin-d" is allowed to be effective. On the contrary, when a level of the pin-c is "1", a pin-b is selected, and the path expressed by "pin-b→selector→circuit→pin-d" is allowed to be effective. However, in the circuit shown in FIG. 10, the pin-c is clamped to the level of "0" so that the circuit of FIG. 10 always functions as the path expressed by "pin-a→selector→circuit→pin-d". Therefore, in the circuits of FIG. 10, the following three paths exist physically.

path-X: "pin-a→selector→circuit→pin-d"

path-Y: "pin-b→selector→circuit→pin-d"

path-Z: "pin-c→selector→circuit→pin-d"

However, since the path-Y makes no operation and the path-Z makes no signal change, these paths-Y and Z will be meaningless logically, that is, they will be redundant paths.

In the conventional system, the result memory 3 stores the information of each path as well as the delay time of the foregoing redundant paths computed by the delay time calculator 202. Therefore, the analysis results for the logically meaningful paths and those for the redundant paths are mixed in the result memory 3, so that judgment operations of the analysis results will be difficult.

Moreover, when paths unsatisfying design requirements of the previously decided delay time are extracted as erroneous paths, the redundant paths unsatisfying design requirements also are displayed as the erroneous paths. Such erroneous paths are called a pseudo erroneous path because they are essentially not an erroneous path.

In order to delete the erroneous paths, after the path extraction and the delay computation, the pseudo erroneous paths have been deleted from the analysis results according to the information of previously designated pseudo erroneous paths.

However, there may be mistakes about the designations for deleting the pseudo erroneous paths. Therefore, when essentially erroneous paths are erroneously designated as the pseudo erroneous path, in spite of the existence of the erroneous paths, there is a possibility that all of the analysis results are erroneously judged as normal ones.

SUMMARY OF THE INVENTION

In view of the foregoing problem of the conventional system, an object of the present invention is to provide an analysis system for a logic circuit which is capable of verifying whether designations to delete pseudo erroneous paths are correct.

In a circuit analysis system according to a first aspect of the present invention, a verifier verifies whether a designation of a path to be excluded from paths included in circuit information is correct. An analyzer extracts paths from said circuit information, and selects paths by deleting the designated path verified by said verifier from the extracted paths, thereby computing a delay time for each of the selected paths.

BRIEF DESCRIPTION OF THE DRAWINGS

The above-mentioned and other objects, features and advantages of this invention will become more apparent by reference to the following detailed description of the invention taken in conjunction with the accompanying drawings in which.

DETAILED DESCRIPTION OF THE PREFERRED EMBODIMENTS

A logic circuit analysis system in accordance with preferred embodiments of the present invention will be described in detail with reference to the accompanying drawings.

Figure 1:
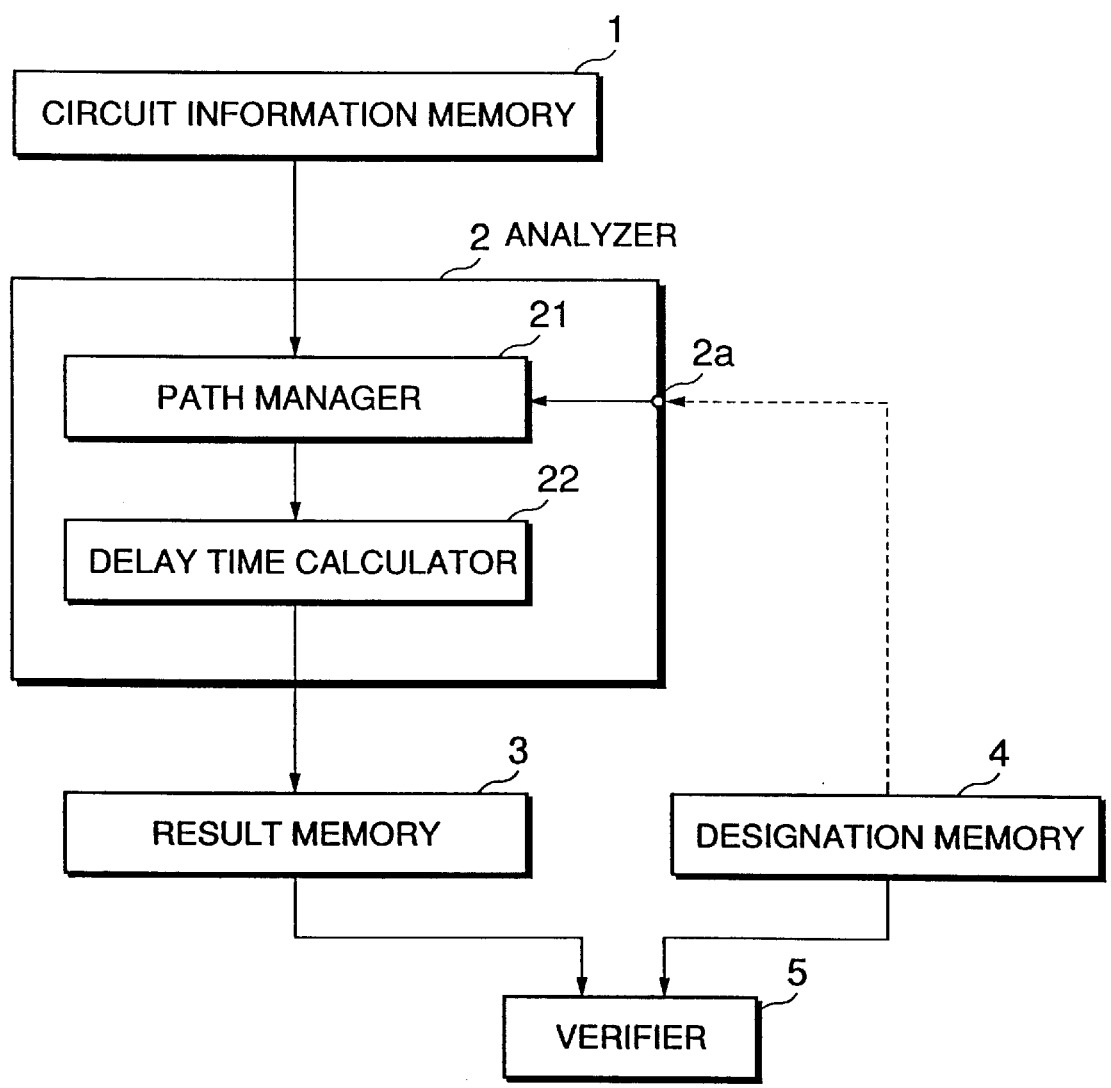
FIG. 1 is a block diagram showing a configuration of a first embodiment of a logic circuit analysis system of the present invention.

Referring to FIG. 1, in the first embodiment of the present invention, a logic circuit analysis system has a circuit information memory 1, an analyzer 2, a result memory 3, a designation memory 4, and a verifier 5.

The circuit information memory 1 stores circuit information of a logic circuit that is an analysis target. Various types of the circuit information are available. In this embodiment, each pin in the logic circuit is dealt with as a node and each connection therein is dealt with as an arc. A delay time in each connection is expressed as a graph structure in which it is added as a weight of the arc.

Figure 3:
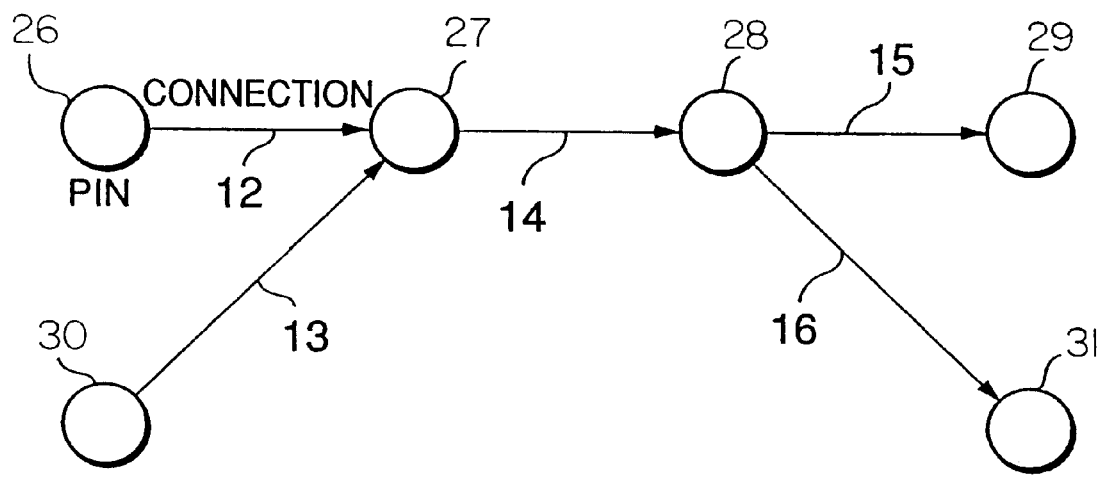
FIG. 3 is an example of a circuit information of a logic circuit.

Referring to FIG. 3, in an example of the circuit information of the logic circuit, nodes 26 to 31 correspond to the pins, and arcs 12 to 16 correspond to connections among the pins. The weight of each arc, that is, the delay time of each connection, shall be collectively expressed as "1 ns" for the convenience of description.

Referring to FIG. 1, the analyzer 2 analyzes the circuit information of the logic circuit stored in the circuit information memory 1, thereby obtaining the paths included in the logic circuit and their delay times. The analyzer 2 further includes a path manager 21 and a delay calculator 22.

The path manager 21 possesses a function to extract paths from the circuit information of the logic circuit and a function to select paths from which pseudo erroneous paths are excluded from among the extracted paths. Specifically, the circuit information of the logic circuit stored in the circuit information memory 1 is analyzed, and for example a path in a depth direction is obtained according to the DFS method, thereby outputting it to the delay time calculator 22. It should be noted that when the designation of a pseudo erroneous path is input to a designation input terminal 2a, the paths from which the designated pseudo erroneous paths are excluded from among the foregoing extracted paths are outputted to the delay time calculator 22.

The delay time calculator 22 computes the delay time for each path outputted from the path manager 22 and the computation result is stored in the result memory 3 together with information of each path.

For example, when no designation is inputted to the designation input terminal 2a in the circuit of FIG. 3, the path manager 21 extracts all of the following paths.

path-A: (26)→12→(27)→14→(28)→15→(29)

path-B: (26)→12→(27)→14→(28)→16→(31)

path-C: (30)→13→(27)→14→(28)→15→(29)

path-D: (30)→13→(27)→14→(28)→16→(31)

The delay time calculator 22 obtains a delay time of "3 ns" for the foregoing paths-A to D, respectively, and outputs the following analysis results to the result memory 3.

path-A: ((26)→12→(27)→14→(28)→15→(29))    3 ns path-B: ((26)→12→(27)→14→(28)→16→(31))    3 ns path-C: ((30)→13→(27)→14→(28)→15→(29))    3 ns path-D: ((30)→13→(27)→14→(28)→16→(31))    3 ns The designation memory 4 stores the designated pseudo erroneous paths therein. The designation style stored here is inputted to the verifier 5 at the time of verifying. Moreover, after the legality of the designation can be verified, the designation style is inputted to the designation input terminal 2a of the analyzer 2. Specifically, the designation stored in the designation memory 4 has a style to be utilized as an input to the analyzer 2.

As a designation style to delete the pseudo erroneous paths, various types are thought out. For example, in case where the information of the logic circuit has a graph structure as is shown in FIG. 3, there are a way to designate an arc, a way to designate a node and the like. In the way to designate the arc, a certain arc is designated, and all of the paths passing through the node are excluded from analysis targets. In the way to designate the node, a certain node is designated, and all of the nodes passing through the node are excluded from the analysis targets. In the following description, the way to designate an arc are employed.

For example, in the graph structure of FIG. 3, when exclusions of the paths-A and B from the analysis targets are intended as the pseudo erroneous path, an arc 12 may be designated as a designated one in order to delete the pseudo erroneous path. However, the logic circuit is actually complicated, so that an erroneous arc would be designated. For example, in FIG. 3, the erroneous designation of the arc 15 or 16 leads to deleting not only the paths-A and B but also the paths-C and D.

The verifier 5 extracts a character error path stored in the designation memory 4 from among the paths stored in the result memory 3, in order to confirm such erroneous designation, and display it on a screen of a display apparatus.

For example, it is assumed that an arc 14 is designated erroneously in order to exclude the paths-A and B from the analysis target, the verifier 5 extracts all of the paths including the path 14, and displays it on the screen of the display apparatus. As a result, the paths-C and D that are essentially the analysis target are also displayed besides the paths-A and B, so that is found that the designation error has been occurred.

When the designation error has occurred, the designation of the designation memory 4 is corrected. After the correction, the above described verifying is performed again. For example, when the arc 12 is designated and the verifying is performed again, the verifier 5 extracts the paths-A and B including the arc 12 and displays them. It is judged that only the pseudo erroneous paths are included and the designation is performed appropriately, by this displaying.

After the verification of the designation is completed, the designation after the verification, which is stored in the designation memory 4, is inputted to the designation input terminal 2a of the analyzer 2, and the analyzer 2 is started to operate. In the analyzer 2, the path manager 21 extracts the four paths-A to D by means of analysis for the circuit information stored in the circuit information memory 1 and thereafter excludes the paths-A and B including the designated arc 12. Subsequently, the path manager 21 gives the remaining paths-C and D to the delay time calculator 22. The delay time calculator 22 computes the delay time of each of the paths-C and D, and allows the result memory 3 to store them. As a result, the analysis results for the paths which are logically meaningful will be stored in the result memory 3, resulting in facilitation of the judgment operation for the analysis results.

Next, an operation of the first embodiment of the present invention will be described below.

Figure 2:
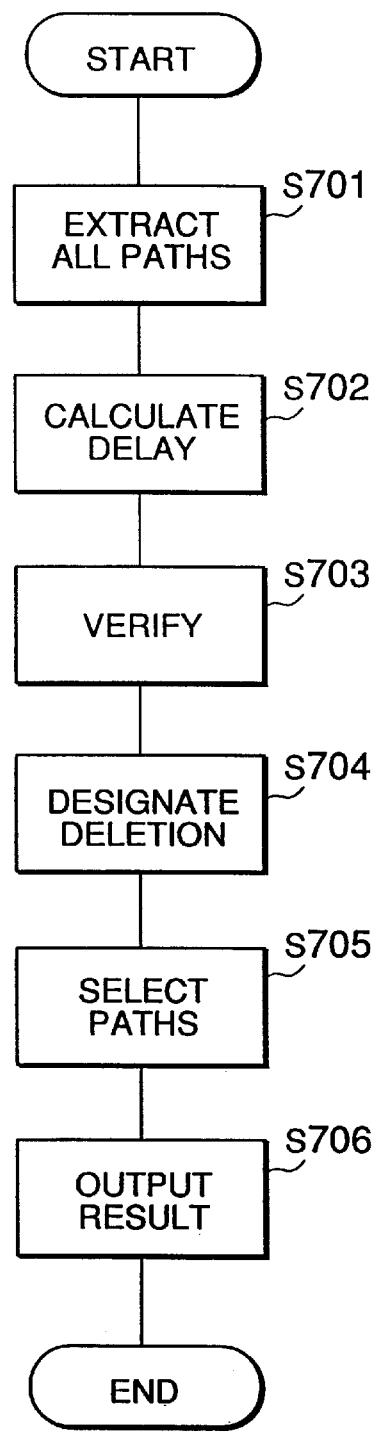
FIG. 2 is a flow chart showing an operation in the first embodiment of the present invention.

Referring to FIGS. 1 and 2, the path manager 21 extracts the paths from the circuit information of the logic circuit stored in the circuit information memory 1 (step S701). Subsequently, the delay time calculator 22 computes the delay time for each of the extracted paths (step S702). The information concerning for each of the paths is stored in the result memory 3.

The verifier 5 extracts the paths stored in the designation memory 4 from among the paths stored in the result memory 3 and displays them. By this displaying, the verify operation is performed (step S703). As a result of this verifying operation, if it is confirmed that a correct path is designated as an pseudo erroneous path, the designation of the path to be stored in the designation memory 4 is inputted to the designation input terminal 2a (step S704).

The path manager 21 deletes the paths inputted to the designation input terminal 2a from among the paths extracted from the circuit information of the logic circuit, which is stored in the circuit information memory 1, thereby selecting the paths to be displayed as erroneous ones (step S705). Then, the delay time calculator 22 computes the delay time for each of the selected paths. The information concerning each path is stored in the result memory 3. The verifier 5 extracts the paths stored in the designation memory 4 to display them (step S706). By this displaying, an operation for judging whether erroneous paths exist is facilitated.

It should be noted that although in the above description the computation for the delay time is executed twice, the first computation result is previously stored in the result memory 3, and the secondary computation may be omitted by utilizing the first computation result after the path selection. Moreover, the first computation can be omitted without being performed and the computation may be performed only after the path selection.

Next, a second embodiment of the present invention will be described with reference to the accompanying drawings in detail below.

Figure 4:
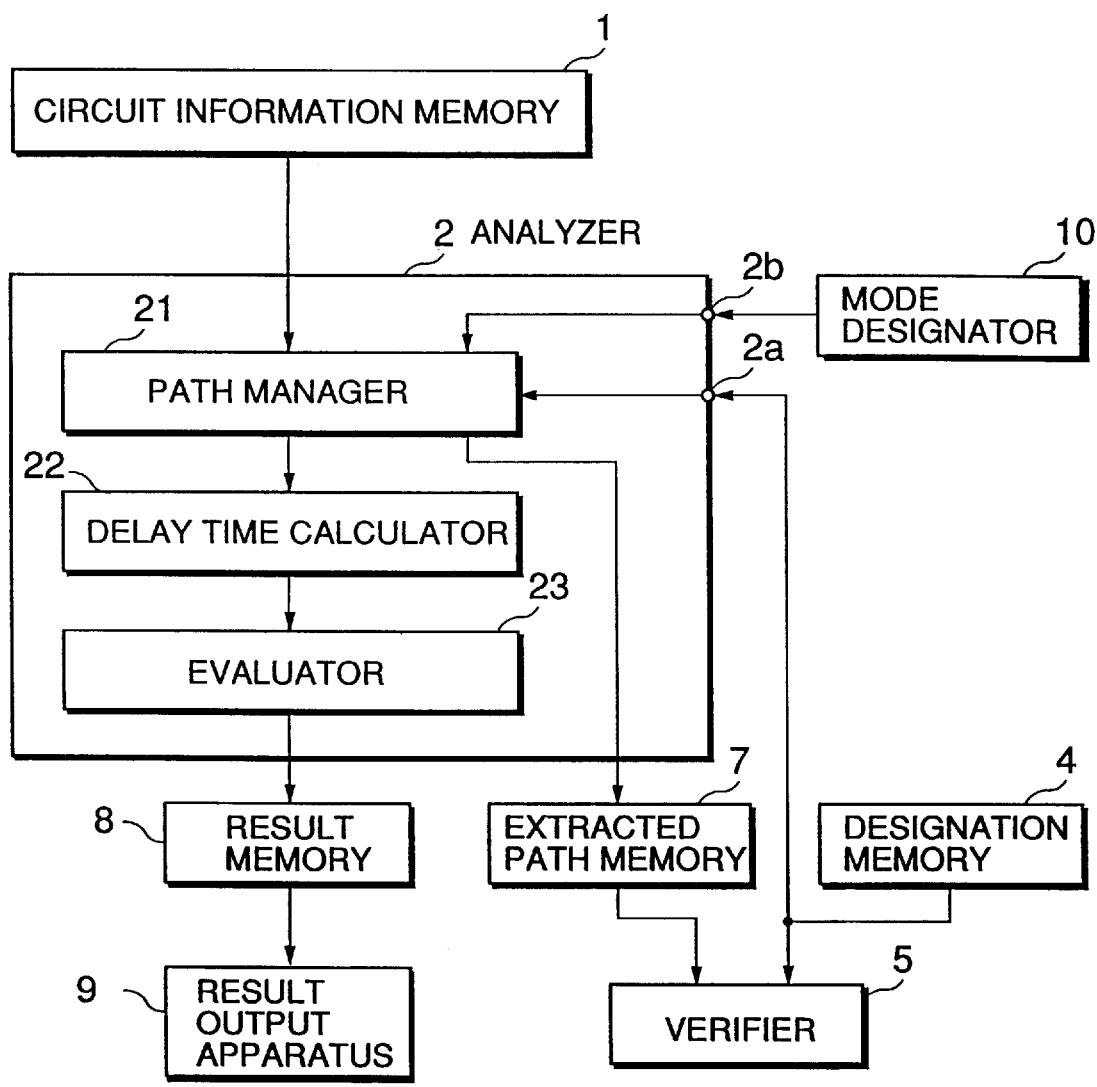
FIG. 4 is a block diagram showing a configuration of a second embodiment of a logic circuit analysis system of the present invention.

Referring to FIG. 4, in the second embodiment of the embodiment, the logic circuit analysis system has a circuit information memory 1, an analyzer 2, a designation memory 4, a verifier 5, an extracted path memory 7, a result memory 8, a result output memory 9, and a mode designator 10.

The circuit information memory 1 and the designation memory 4 possess the same functions as those of the first embodiment.

The mode designator 10 stores an operation mode for the analyzer 2. With regard to the operation mode, there are first and second modes. The first mode means that the designation path is being verified. The second mode means an analysis operation after verifying.

The analyzer 2 has a designation input terminal 2a for receiving the designation stored in the designation memory 4, and a mode input terminal 2b for receiving the designation mode stored in the mode designator 10. The analyzer 2 performs different processings in the first and second modes. At the time of the designation of the first mode, the analyzer 2 analyzes the circuit information of the logic circuit stored in the circuit information memory 1 and extracts the paths included in the logic circuit, thereby outputting them to the extracted path memory 7. At the time of designation of the second mode, the analyzer 2 analyzes the information of the logic circuit stored in the circuit information memory 1 and extracts the paths included in the logic circuit, thereby selecting the paths other than the designated paths inputted to the designation input terminal 2a, from among the extracted paths. Then, the analyzer 2 obtains the delay time for each of the selected paths. Moreover, the analyzer 2 checks whether the delay time satisfies the design requirements. The analyzer 2 generates analysis results including the paths as an erroneous path which do not satisfy design requirements. In case of this embodiment, the analyzer 2 comprises a path manager 21, a delay time calculator 22 and an evaluator 23.

When the designation of the first mode is inputted to the mode input terminal 2b, the path manager 21 analyzes the information of the logic circuit stored in the circuit information memory 1, and obtains the path in the depth direction for example according to the DFS method. The path manager 21 outputs the path to the extracted path memory 7. Moreover, when the designation of the second mode is inputted to the mode input terminal 2b, the path manager 21 extracts the path while considering the designation from the designation input terminal 2a. Specifically, the path manager 21 analyzes the information of the logic circuit stored in the circuit information memory 1, and obtains the path in the depth direction for example according to the DFS method, thereby outputting to the delay time calculator 22 the path other than the ones in agreement with the designation inputted from the designation input terminal 2a.

The delay time calculator 22 and the evaluator 23 operate only at the time of the second mode. The delay time calculator 22 computes the delay time for each path outputted from the path manager 22, and outputs the delay time together with the information of each path to the evaluator 23. The evaluator 23 examines for each path outputted from the delay time calculator 22 whether the computed delay time satisfies the one of the design requirement previously set. The evaluator 23 outputs the analysis result including the information of the path unsatisfying design requirements and the delay time of that path to the result memory 8.

The result output apparatus 9 displays the information of the erroneous path stored in the result memory 8 on, for example, a screen of a display apparatus.

From among the paths stored in the extracted path memory 7, the verifier 5 extracts the path in agreement with the designation stored in the designation memory 4, and displays the path on the screen of the display apparatus and the like.

Next, an operation of the second embodiment of the present invention will be described.

It should be noted that the circuit information shown in FIG. 3 is stored in the circuit information memory 1 and the foregoing two paths-A and B shall be excluded from the analysis target in order to remove the pseudo erroneous path. Moreover, after the designation of the path which is intended to be excluded from the analysis target is stored in the designation memory 4, the first mode is designated by the mode designator 10, whereby the analyzer 2 is started. Here, it is assumed that the designation of the arc 14 is stored in the designation memory 4 erroneously.

Figure 5:
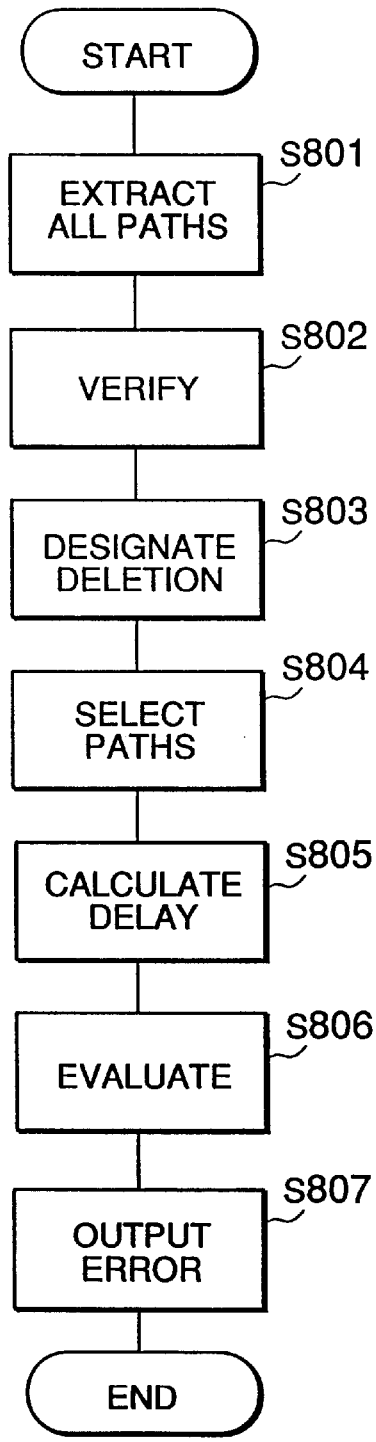
FIG. 5 is a flow chart showing an operation in the second embodiment of the present invention.

Referring to FIGS. 4 and 5, since the first mode is designated, the path manager 21 of the analyzer 2 extracts the four paths-A to D for the circuit information illustrated in FIG. 3 and outputs them to the extracted path memory 7 (step S801).

The verifier 5 displays the paths-A to D as the ones in agreement with the designation (arc 14) which is stored in the designation memory 4, from among the four paths-A to D stored in the extracted path memory 7. As a result, since also the paths-C and D which are essentially an analysis target are displayed besides the paths-A and D, it is found that the designation error occurred.

When the designation is erroneously performed, after the designation of the designation memory 4 is corrected, the verification operation is performed again. When for example, the arc 12 is designated, the verifier 5 extracts the paths-A and B including the arc 12 and displays them. By this displaying, it is proved that the pseudo erroneous path is designated appropriately (step S802).

After the verification of the designation is completed, the second mode is stored in the mode designator 10, and the analyzer 2 is started. To the designation input terminal 2a, the pseudo erroneous path, for which the verification has been completed, is designated from the designation memory 4 (step S803).

After the four paths-A to D are extracted by the analysis of the circuit information of the circuit information memory 1, the path manager 21 of the analyzer 2 excludes the paths-A and B including the designated arc 12, and outputs the remaining paths-C and D to the delay time calculator 22 (step S804). The delay time calculator 22 computes the delay time of each path, and outputs them to the evaluator 23 (step S805). The evaluator 23 compares the delay time of each path with the design requirement. If any path unsatisfying design requirement exists, the information and delay time of this path are outputted as the analysis result to the result memory 8 (step S806). The result output apparatus 9 displays this analysis result (step S807). In this case, the path included in the displayed analysis result is dealt with as an erroneous path.

Next, a third embodiment of the present invention will be described.

Figure 6:
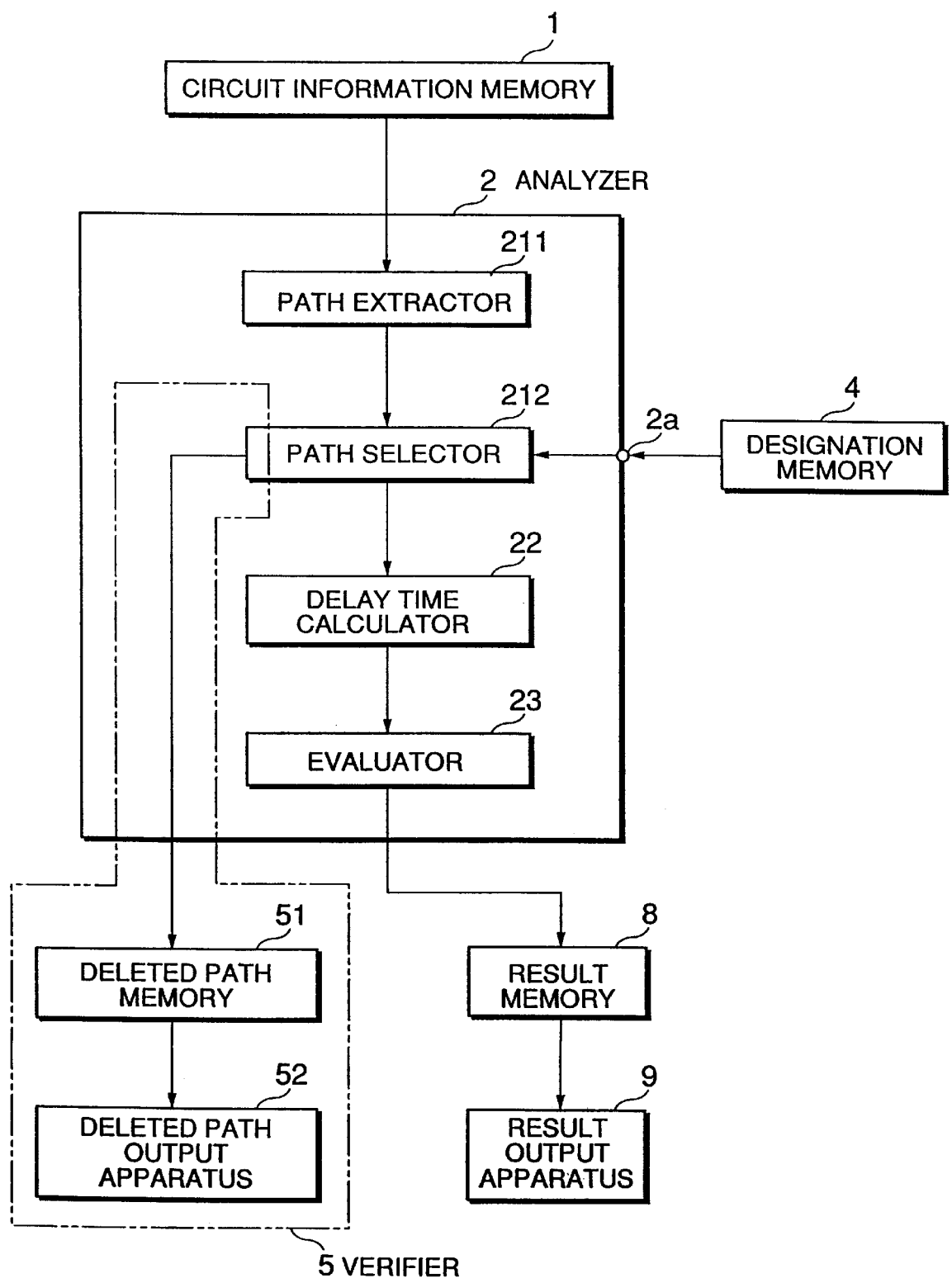
FIG. 6 is a circuit diagram showing a configuration of a third embodiment of a logic circuit analysis system of the present invention.
Figure 7:
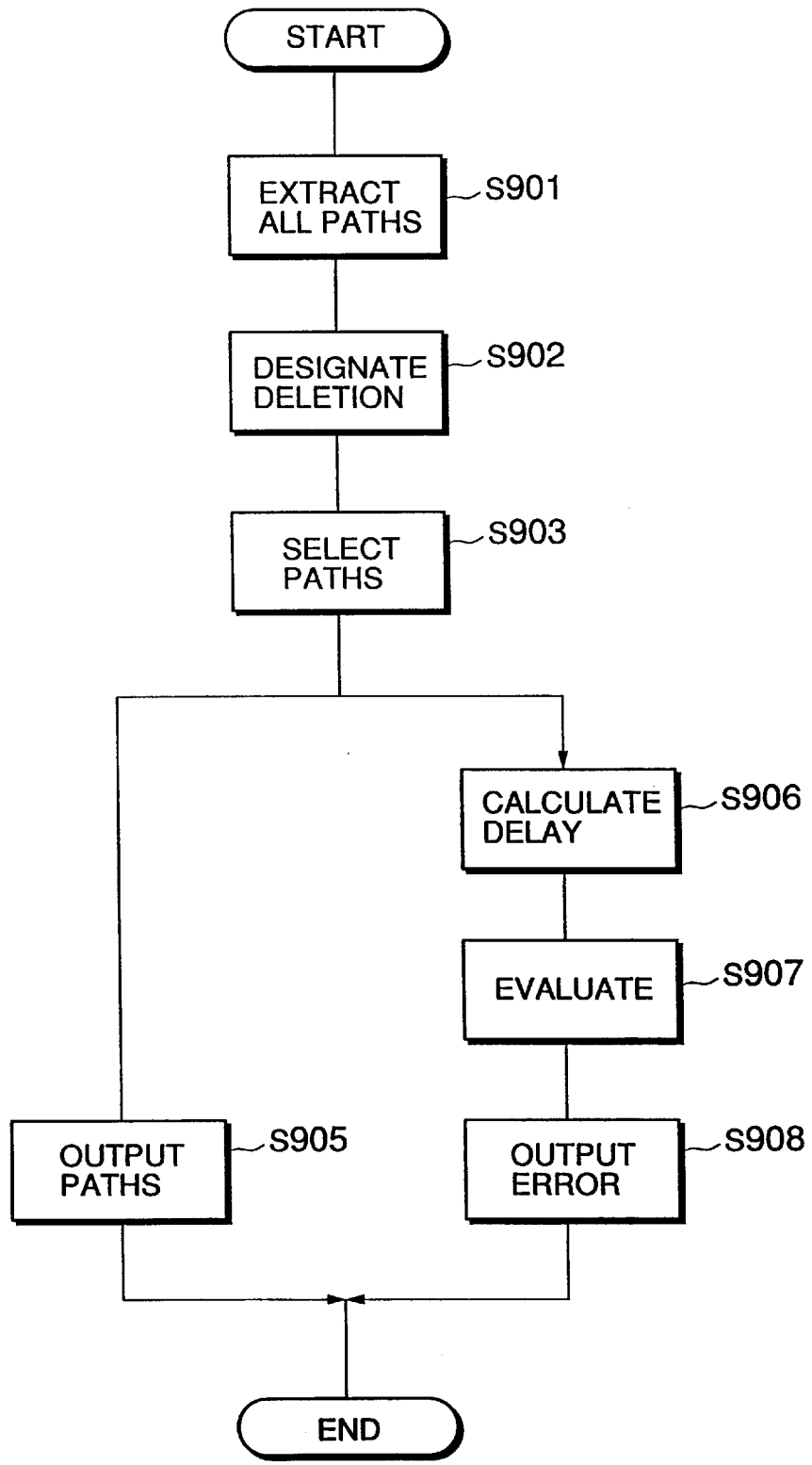
FIG. 7 is a flow chart showing an operation in the third embodiment of the present invention.

Referring to FIG. 6, in the third embodiment of the present invention, a logic circuit analysis system has a circuit information memory 1, an analyzer 2, a designation memory 4, a result memory 8, a result output apparatus 9, a deleted path memory 51, and a deleted path apparatus 52.

The circuit information memory 1 and a designated memory 4 possess the same function as those of the first embodiment.

The analyzer 2 analyzes information of the logic circuit stored in the circuit information memory 1, and extracts all of the paths included in this logic circuit. The analyzer 2 outputs as the excluded path (pseudo erroneous path) the designated path inputted from the designation input terminal 2a among the extracted paths and, at the same time, obtains the delay times for the paths other than the designated path outputted therefrom. Further, the analyzer 2 checks whether the delay times satisfy the design requirement. In case of this embodiment, the analyzer 2 comprises a path extractor 211. A path selector 212, a delay time calculator 22, and an evaluator 23.

The path extractor 211 analyzes information of the logic circuit stored in the circuit information memory 1, and obtains the path in the depth direction, for example, according to the DFS method, thereby outputting it to the path selector 212. The path selector 212 outputs, from among the paths extracted by the path extractor 211, the paths in accordance with the designation inputted from the designation input terminal 2a to the deleted path memory 51. The path selector 212 outputs the paths other than the ones, which are outputted to the deleted path memory 51, to the delay time calculator 22. The delay time calculator 22 computes the delay time for each path outputted from the path selector 212, and outputs them to the evaluator 23 together with the information of each path.

The evaluator 23 examines for each path outputted from the delay time calculator 22 whether the delay time of each path satisfies the design requirement previously set. The evaluator 23 outputs the analysis result which includes the information of the paths unsatisfying design requirement and the delay times of them to the result memory 8.

The deleted path apparatus 52 displays the paths stored in the deleted path memory 51, for example, on a screen of a display apparatus.

The result output apparatus 9 displays the information of the erroneous paths stored in the result memory 8, for example, on the screen of the display apparatus.

In the embodiment of the present invention, the verifier 5 which verifies whether the designation stored in the designation memory 4 is correct or not is composed of a part of the path selector 212, a deleted path memory 51 and the deleted path apparatus 52.

Next, an operation of the third embodiment of the present invention will be described.

It should be noted that the circuit information shown in FIG. 3 is stored in the circuit information memory 1 and the foregoing two paths-A and B shall be excluded from the analysis target in order to remove the pseudo erroneous path. Moreover, after the designation of the path which is intended to be excluded from the analysis target is stored in the designation memory 4, the analyzer 2 is started. Here, the designation of the arc 12 shall be stored in the designation memory 4.

The path extractor 211 of the analyzer 2 extracts the foregoing four paths-A and D with respect to the circuit information shown in FIG. 3, and outputs them to the path selector 212(step S901). The path selector 212 follows the designation stored in the designation memory 4 (step S902), and outputs the paths-A and B in accordance with the designation (arc 12) as the excluded path to the deleted path memory 51. At the same time, the path selector 212 outputs to the delay time calculator 22 the paths-C and D other than the ones outputted to the deleted path memory 51 (step S903).

The delay time calculator 22 computes the delay times of the paths-C and D (step S906). The evaluator 23 compares the computation results with the design requirement, whereby the evaluator 23 detects the erroneous paths and outputs the analysis result to the result memory 8 (step S907).

The deleted path apparatus 52 displays the two paths-A and B stored in the deleted path memory 51 (step S905). As a result, since only the paths-A and B are displayed, which are essentially to be excluded, it is verified that the designation is correct.

On the other hand, the result output apparatus 9 displays the analysis stored in the result memory 8 (step S908). In this case, since the correctness of the designation has been verified, the paths in the analysis result displayed are the erroneous ones.

Next, a hardware structure of the analysis system for the logic circuit to which the present invention is applied will be described.

Figure 8:
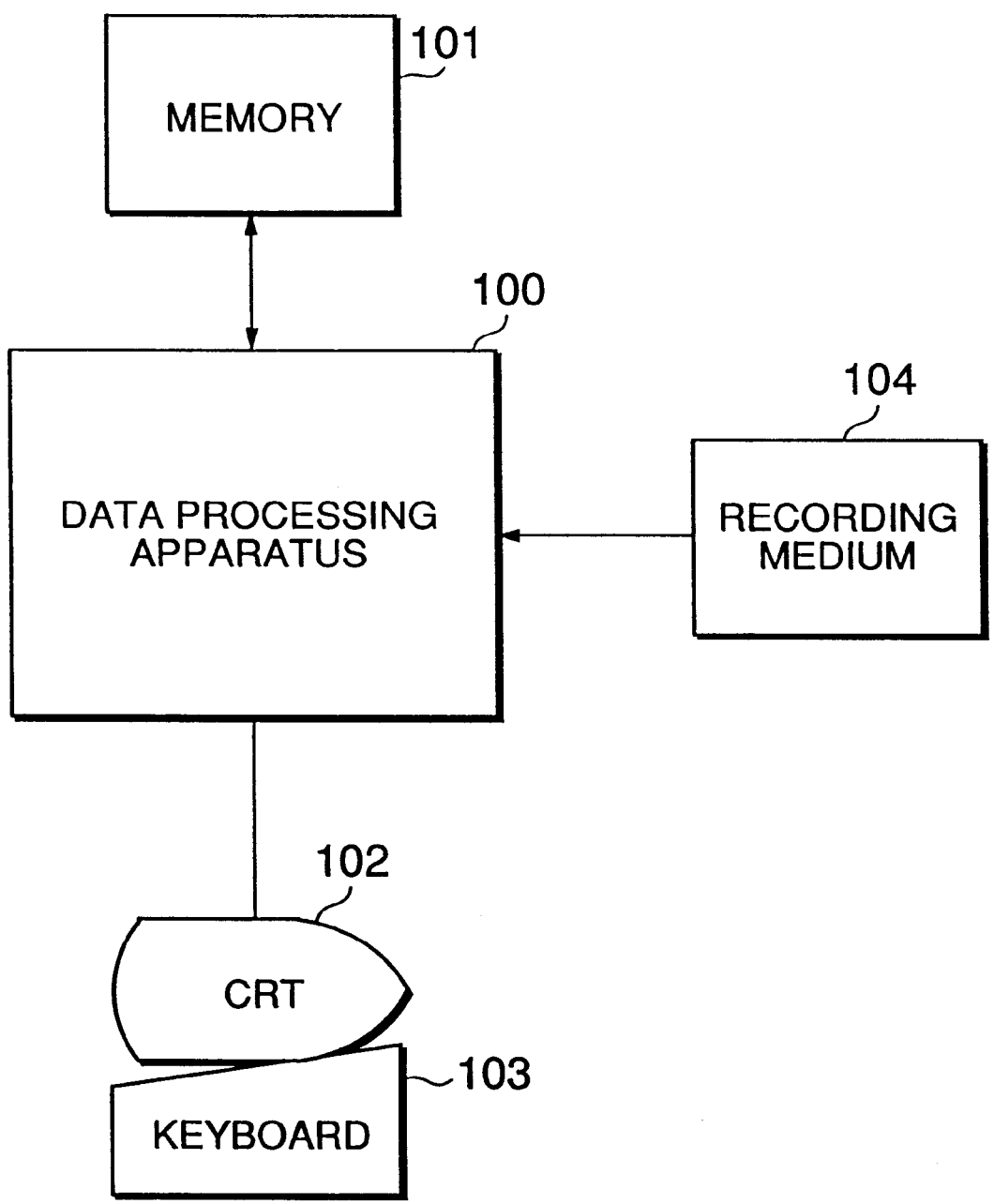
FIG. 8 is block diagram showing an example of a hardware configuration of the analysis system of the present invention.
Figure 9:
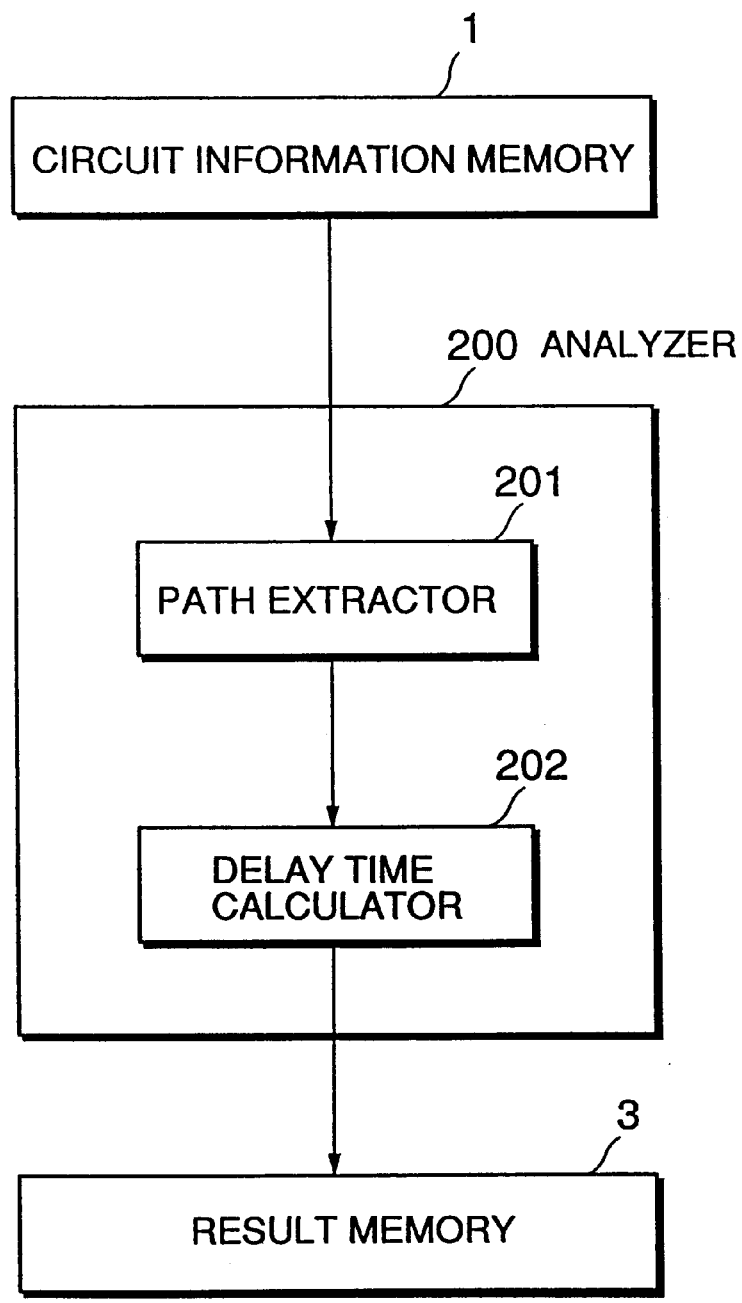
FIG. 9 is a block diagram showing a conventional analysis system for a logic circuit.
Figure 10:
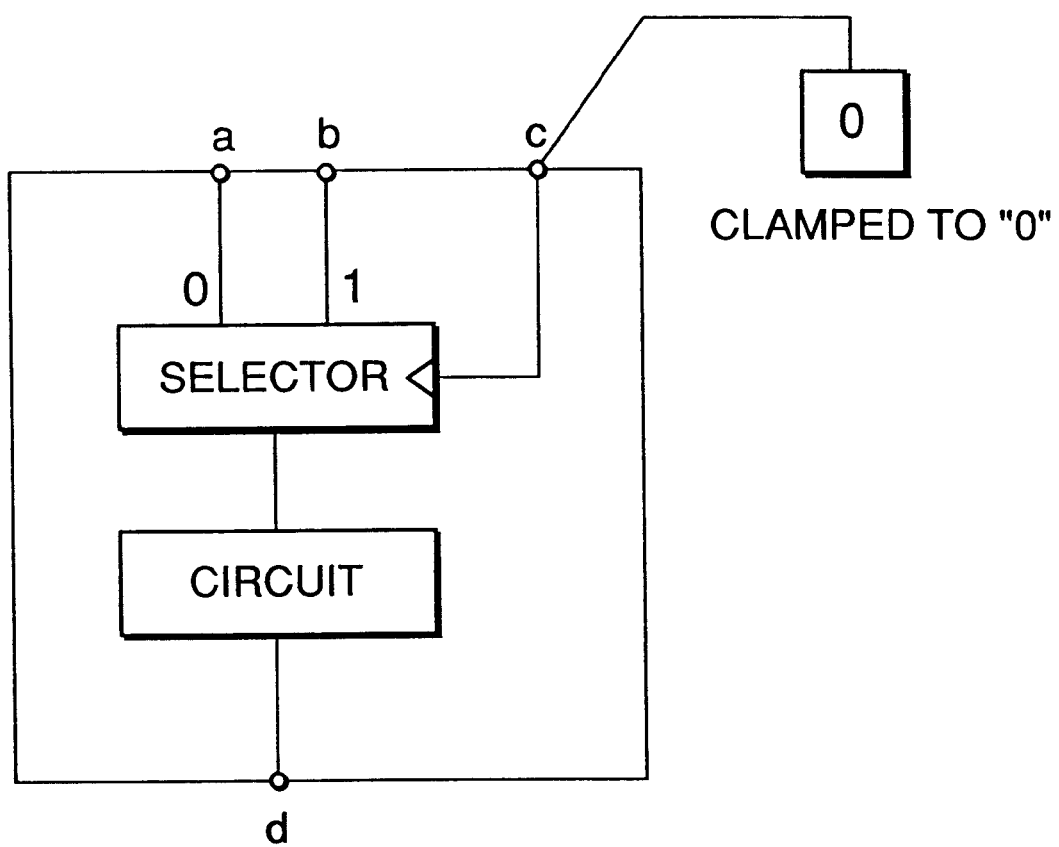
FIG. 10 is an example of a logic circuit including a redundant path.

Referring to FIG. 8, the logic circuit analysis system has a data processing apparatus 100, a memory 101, a display apparatus (e.g., a CRT 102), an input apparatus (i.e., a key board 103), and a recording medium 104. The recording medium 104 may be a magnetic disc, a semiconductor memory or the like. A logic circuit analysis program in the recording medium 104 is read into the data processing apparatus 100, and controls the operation of the data processing apparatus 100, thereby allowing the data processing apparatus 10 to function as each means. Specification, in the first embodiment of the present invention, the data processing apparatus 100 functions as the circuit information memory 1, the analyzer 2, the result memory 3, the designation memory 4, and the verifier 5. In the second embodiment of the present invention, the data processing apparatus 100 functions as the circuit information memory 1, the analyzer 2, the designation memory 4, the verifier 5, the extracted path memory 7, the result memory 8, the result output apparatus 9, and the mode designator 10. In the third embodiment of the present invention, the data processing apparatus 100 functions as the circuit information memory 1, the analyzer 2, the designation memory 4, the result memory 8, the result output apparatus 9, the deleted path memory 51, and the deleted path apparatus 52.

In the above described embodiments, the present invention is applied to the delay analysis system. The present invention can be applied also to a noise analysis (a signal analysis) and the like, which simulates wave shapes of signals in wiring and simulates influences which the wiring receives from the circumference including signal on the wiring. As described above, according to the present invention, in order to exclude the pseudo error, it can be confirmed whether the designation itself is erroneous or not. It can be prevented that the erroneous designation is overlooked, leading to judging erroneously that all of the analysis results are normal in spite of existence of the erroneous paths.

While the invention has been described in terms of several preferred embodiments, those skilled in the art will recognize that the invention can be practiced with modification within the spirit and scope of the appended claims.

What is claimed is:

1. A circuit analysis method comprising:

designating paths within a circuit as pseudo erroneous;

extracting all paths for the circuit;

displaying paths which are comprised of at least one path designated as pseudo erroneous, for user confirmation that the designated paths were correctly designated as pseudo erroneous;

selecting paths by deleting the paths correctly designated as pseudo erroneous from all of the paths previously extracted;

computing a delay time for each of the selected paths; and judging whether the computed delay time of each of said selected paths satisfies predetermined requirements.

2. A computer-readable storage medium recording thereon a program enabling a computer to perform:

a processing for designating paths within a circuit as pseudo erroneous;

a processing for extracting all paths for the circuit;

a processing for displaying paths which are comprised of at least one path designated as pseudo erroneous for user confirmation that the designated paths were correctly designated as pseudo erroneous;

a processing for selecting paths by deleting the paths correctly designated as psuedo erroneous from all the paths previously extracted;

a processing for computing a delay time for each of the selected paths; and a processing for judging whether the computed delay time for each of the selected paths satisfies predetermined requirements.

3. A circuit analysis system comprising:

a memory, storing circuit information and storing circuit paths designated as pseudo erroneous;

a verifier;

an analyzer, comprising:

a path manager, which extracts all paths from the circuit information in memory, outputs all of the extracted paths to said verifier, and deletes, from all of the extracted paths, paths comprised of at least one path designated as pseudo erroneous;

a delay time calculator, which computes delay times for paths remaining after the paths comprised of at least one path designated as psuedo erroneous are deleted; and an evaluator, which evaluates the remaining paths based upon the computed delay times, outputting each path having a delay time which does not satisfy previously set design requirements, wherein said verifier displays the paths designated as psuedo erroneous together with all of the extracted paths, for user confirmation that paths in memory were correctly designated as pseudo erroneous.

4. The circuit analysis system according to claim 3, wherein when the user determines that a designated path displayed by said verifier was incorrectly designated as pseudo erroneous, the corresponding designation is corrected in memory and said verifier displays the corrected designated paths together with the extracted paths.

5. The circuit analysis system according to claim 3, wherein the circuit paths designated as pseudo erroneous in memory comprise at least one arc or connection within at least one of the extracted paths.

6. A circuit analysis system comprising:

a memory, storing circuit information and storing circuit paths designated as pseudo erroneous;

a verifier;

an analyzer, comprising:

a path extractor, which extracts all paths from the circuit information in memory;

a path selector, which deletes, from the extracted paths, paths comprised of at least one path designated as pseudo erroneous, and outputs the deleted paths to said verifier;

a delay time calculator, which computes delay times for paths remaining after the paths comprised of at least one designated as pseudo erroneous are deleted from all of the extracted paths; and an evaluator, which evaluates the remaining paths based upon the computed delay times, outputting each path having a delay time which does not satisfy previously set design requirements, wherein said verifier displays the deleted paths for user confirmation that paths in memory were correctly designated as pseudo erroneous.

7. The circuit analysis system according to claim 6, wherein when the user determines that a deleted path displayed by said verifier was incorrectly deleted due to an incorrect designation of a path as pseudo erroneous, the corresponding designation is corrected in memory and said verifier displays the deleted paths based on the corrected designation.

8. The circuit analysis system according to claim 6, wherein the circuit paths designated as pseudo erroneous in memory comprise at least one arc or connection within at least one of the extracted paths.

* * * * *